(12) United States Patent
Gai et al.

(10) Patent No.: US 10,861,926 B2
(45) Date of Patent: Dec. 8, 2020

(54) DISPLAY SUBSTRATE, DISPLAY APPARATUS, AND FABRICATING METHOD THEREOF

(71) Applicant: BOE TECHNOLOGY GROUP CO., LTD., Beijing (CN)

(72) Inventors: Cuili Gai, Beijing (CN); Ling Wang, Beijing (CN); Yicheng Lin, Beijing (CN); Baoxia Zhang, Beijing (CN); Pan Xu, Beijing (CN); Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/303,340

(22) PCT Filed: Apr. 26, 2018

(86) PCT No.: PCT/CN2018/084622
§ 371 (c)(1),
(2) Date: Nov. 20, 2018

(87) PCT Pub. No.: WO2019/033786
PCT Pub. Date: Feb. 21, 2019

(65) Prior Publication Data
US 2019/0221633 A1    Jul. 18, 2019

(30) Foreign Application Priority Data
Aug. 17, 2017    (CN) .......................... 2017 1 0706679

(51) Int. Cl.
*H01L 27/32* (2006.01)
*G09G 3/3225* (2016.01)
(Continued)

(52) U.S. Cl.
CPC ....... *H01L 27/3276* (2013.01); *G09G 3/3225* (2013.01); *H01L 27/329* (2013.01);
(Continued)

(58) Field of Classification Search
CPC ............. H01L 27/3276; H01L 27/3279; H01L 27/3288; H01L 27/329; H01L 51/5012
(Continued)

(56) References Cited

U.S. PATENT DOCUMENTS

| | | |
|---|---|---|
| 2013/0069067 A1 | 3/2013 | Youn |
| 2014/0183479 A1 | 7/2014 | Park et al. |

(Continued)

FOREIGN PATENT DOCUMENTS

| | | |
|---|---|---|
| CN | 101021657 A | 8/2007 |
| CN | 202917543 U | 5/2013 |

(Continued)

OTHER PUBLICATIONS

International Search Report dated Aug. 1, 2018, issued in counterpart International Application No. PCT/CN2018/084622. (9 pages).
(Continued)

*Primary Examiner* — Elias Ullah
(74) *Attorney, Agent, or Firm* — Westerman, Hattori, Daniels & Adrian, LLP

(57) ABSTRACT

The present disclosure is related to a display substrate. The display substrate may include a plurality of pixel units. Each of the plurality of pixel units may include a first electrode and a second electrode on a base substrate. At least one of the pixel units further comprises an auxiliary electrode and a connecting structure between the auxiliary electrode and the first electrode. The connecting structure may be configured to electrically connect the auxiliary electrode to the first electrode.

15 Claims, 2 Drawing Sheets

(51) Int. Cl.
  *H01L 51/50* (2006.01)
  *H01L 51/56* (2006.01)
  *H01L 51/52* (2006.01)

(52) U.S. Cl.
  CPC ...... *H01L 27/3279* (2013.01); *H01L 27/3288* (2013.01); *H01L 51/5012* (2013.01); *H01L 51/56* (2013.01); *G09G 2300/0426* (2013.01); *H01L 51/5228* (2013.01); *H01L 2251/5315* (2013.01)

(58) Field of Classification Search
  USPC .......................................................... 257/40
  See application file for complete search history.

(56) References Cited

U.S. PATENT DOCUMENTS

| | | | |
|---|---|---|---|
| 2014/0312323 | A1 | 10/2014 | Park et al. |
| 2016/0155790 | A1 | 6/2016 | Lee et al. |
| 2017/0005150 | A1* | 1/2017 | Yeo ..................... H01L 27/3246 |

FOREIGN PATENT DOCUMENTS

| | | |
|---|---|---|
| CN | 103296052 A | 9/2013 |
| CN | 104 218 182 A | 12/2014 |
| CN | 104218182 A | 12/2014 |
| CN | 104 393 191 A | 3/2015 |
| CN | 104393191 A | 3/2015 |
| CN | 204289455 U | 4/2015 |
| CN | 105655375 A | 6/2016 |

OTHER PUBLICATIONS

Office Action dated Mar. 25, 2020, issued in counterpart CN application No. 201710706679.X, with English translation. (41 pages).

Extended Search Report dated Dec. 16, 2019, issued in counterpart EP Application No. 18800461.8 (9 pages).

* cited by examiner

DISPLAY SUBSTRATE, DISPLAY APPARATUS, AND FABRICATING METHOD THEREOF

CROSS-REFERENCE TO RELATED APPLICATIONS

This application claims benefit of the filing date of Chinese Patent Application No. 201710706679.X filed on Aug. 17, 2017, the disclosure of which is hereby incorporated by reference.

TECHNICAL FIELD

This invention relates to display technology, and more particularly, to a display substrate, a fabricating method thereof, a display apparatus, and a driving method thereof.

BACKGROUND

An organic light-emitting diode (OLED) has advantages such as all-solid state structure, high brightness, full view angle, high response speed, wide-working temperature range, capability of achieving flexible display and the like. Particularly, because it can be curled and folded, the OLED has achieved wide prospects in the field of portable products or wearable products.

An OLED can be divided into two types: a top-emitting OLED and a bottom-emitting OLED. At present, an OLED display product adopting the top-emitting OLED can realize high PPI and increase opening rate. However, since the top-emitting OLED emits light from the side where the cathode is located, the cathode needs to be made of a transparent conductive material. As such, the IR drop of the cathode is large, thereby affecting uniformity of the panel and the display quality thereof.

BRIEF SUMMARY

Accordingly, one example of the present disclosure is a display substrate. The display substrate may include a plurality of pixel units. Each of the plurality of the pixel units may include a first electrode and a second electrode on a base substrate. At least one of the pixel units may further include an auxiliary electrode and a connecting structure between the auxiliary electrode and the first electrode and the connecting structure may be configured to electrically connect the auxiliary electrode to the first electrode. The connecting structure may be further configured to apply an auxiliary voltage to the first electrode through the auxiliary electrode. The auxiliary electrode may be in a non-display region of the display substrate.

The at least one of the pixel units may include an isolation layer between the first electrode and the auxiliary electrode. The isolation layer may include a first part; and the first part may be configured to form the connecting structure under action of voltages having a first voltage difference on the auxiliary electrode and the first electrode. A thickness of the first part may be smaller than thicknesses of other parts of the isolation layer and the first part may be configured to have electrical breakdown under the action of the voltages having the first voltage difference on the auxiliary electrode and the first electrode.

The at least one of the pixel units may further include an organic light-emitting diode, and the isolation layer and at least a part of a light-emitting layer of the organic light-emitting diode may be made from a same thin film.

The at least one of the pixel units may further include a flat layer, the flat layer may include at least an accommodating hole, and the auxiliary electrode may be located in the accommodating hole. A cross section of the accommodating hole parallel to a plane where the base substrate is located may be polygonal; the isolation layer may be located in the accommodating hole, and the first part may be located on at least wall of the accommodating hole.

The organic light-emitting diode may be a top-emitting organic light-emitting diode, the first electrode may be a cathode of the organic light-emitting diode, and the cathode may be located on a side of the light-emitting layer away from the base substrate. The auxiliary electrode and an anode of the organic light-emitting diode may be made from a same thin film.

Another example of the present disclosure is a display apparatus. The display apparatus may include a display substrate according to one embodiment of the present disclosure. The display apparatus may further include a driving circuit. The driving circuit may be configured to provide a pixel voltage and an auxiliary voltage to the first electrode and the auxiliary electrode respectively, and a voltage difference between the auxiliary voltage and the pixel voltage is smaller than a preset value or approximately 0.

Another example of the present disclosure is a method of driving the display apparatus. The method of driving the display apparatus may include applying the auxiliary voltage to the auxiliary electrodes and applying the pixel voltage to the first electrodes. A voltage difference between the auxiliary voltage and the pixel voltage in a display process may be smaller than a preset value or approximately 0.

Another example of the present disclosure is a method of fabricating a display substrate. The method of fabricating a display substrate may include forming a first electrode and a second electrode in each of pixel units on a base substrate and forming an auxiliary electrode and a connecting structure in at least one of the pixel units on the base substrate. The connecting structure may be configured to electrically connect the first electrode to the auxiliary electrode and provide an auxiliary voltage to the first electrode through the auxiliary electrode.

The method of fabricating a display substrate may further include forming an isolation layer between the first electrode and the auxiliary electrode. The isolation layer may include a first part. A thickness of the first part may be smaller than that of other parts of the isolation layer. The first part may be configured to form the connecting structure under action of voltages having a first voltage difference on the auxiliary electrode and the first electrode respectively. Forming the connecting structure may include applying the voltages of the first voltage difference to the auxiliary electrodes and the first electrodes respectively. The first part may be subjected to electrical breakdown under the action of the voltages of the first voltage difference on the auxiliary electrode and the first electrode respectively to form the connecting structure.

The method of fabricating the display substrate may further include forming a thin film transistor in each of the pixel units, forming a flat layer covering the thin film transistor, and forming a plurality of accommodating holes in the flat layer. The auxiliary electrode may be located in one of the accommodating holes, and the first part may be located on at least wall of the one of the accommodating holes.

In one embodiment, the display substrate is an organic light-emitting diode display substrate. The method of fabricating the display substrate may further include forming an organic electroluminescence diode on the flat layer in each of the pixel units. The isolation layer and at least a part of a light-emitting layer of the organic light-emitting diode may be made from a same luminescent material in one patterning process. The organic light-emitting diode may be a top-emitting organic light-emitting diode, the first electrode may be a cathode of the top-emitting organic light-emitting diode; and the auxiliary electrode and an anode of the top-emitting organic light-emitting diode may be made from a same metal thin film in one patterning process.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
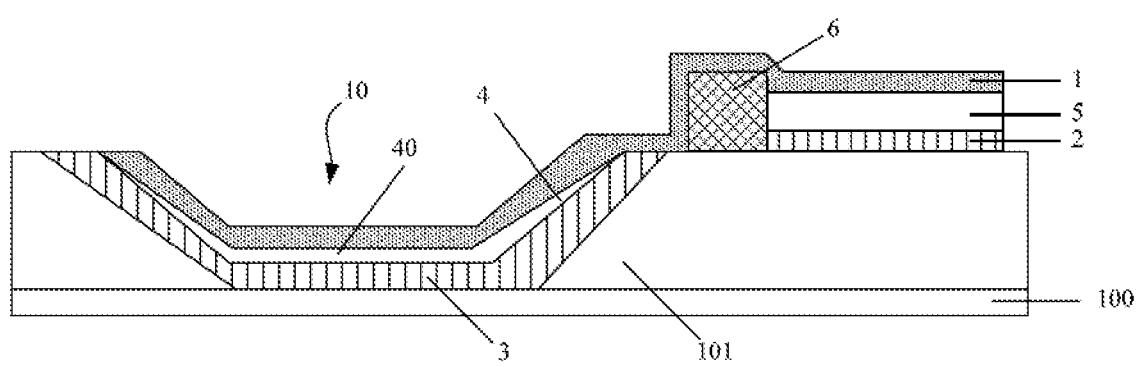
FIG. 1 is a schematic structural diagram of a display substrate according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-2. When referring to the figures, like structures and elements shown throughout are indicated with like reference numerals.

In this specification, numerical terms such as "first," "second," etc. may be added as prefixes. These prefixes, however, are only added in order to distinguish the terms and do not have specific meaning such as order and relative merits.

A display substrate is provided according to one embodiment of the present disclosure. The display substrate is used for solving the problem of large IR drop of a signal in the transmission process, which causes a large voltage difference between an actual voltage transmitted to a display electrode of a pixel unit and a corresponding pixel voltage, thereby influencing the display effect. For convenience of description, this actual voltage is defined as "a first voltage."

The pixel voltage is a voltage supplied to the display electrode by a driving unit or circuit. This voltage is transmitted to the display electrode through a signal line. When the IR drop is not considered, the voltage on the display electrode is the same as the pixel voltage, which is used for controlling the corresponding pixel unit to achieve required display effect including display colors, gray scales, and the like.

In order to solve the technical problem mentioned above, in one embodiment, at least some of the pixel units are provided with an auxiliary electrode and a connecting structure. The connecting structure can realize electric connection of the first electrode and the auxiliary electrode through voltages applied on the auxiliary electrode and the first electrode, respectively which have a first, preset voltage difference, and apply an auxiliary voltage to the display electrode through the auxiliary electrode. The voltage difference between the auxiliary voltage and the pixel voltage supplied to the display electrode is smaller than a preset value or basically zero. As such, the problem of a large voltage difference between the actual voltage on the display electrode, that is, the first voltage, and the corresponding pixel voltage due to the large IR drop can be overcome, thereby guaranteeing the display quality.

In a process of manufacturing a display substrate, a step of applying voltages to the auxiliary electrode and the first electrode having a first, preset voltage difference may be included according to one embodiment of the present disclosure. Under action of the voltages having the first, preset voltage difference on the auxiliary electrode and the first electrode, the first electrode is electrically connected with the auxiliary electrode, thereby guaranteeing the display effect.

A driving unit or circuit can provide a same amount of voltage, a pixel voltage, to the display electrode and the auxiliary electrode. In the transmission process, since the IR drop of the pixel voltage supplied to the auxiliary electrode is small, the voltage difference between the auxiliary voltage actually transmitted to the auxiliary electrode and the pixel voltage is smaller than a preset value or approximately zero. Applying the auxiliary voltage to the display electrode through the auxiliary electrode guarantees display effect of the pixel unit and accordingly increases display quality.

In one embodiment, in order to achieve a small IR drop of the pixel voltage supplied to the auxiliary electrode during the transmission process, the auxiliary electrode and/or the auxiliary signal line used for transmitting the voltage signal to the auxiliary electrode are made of a material with low resistivity.

The driving unit may also provide different amounts of voltages to the display electrode and the auxiliary electrode respectively. Specifically, in one embodiment, the voltage provided by the driving unit to the auxiliary electrode is larger than the pixel voltage provided to the display electrode. As a result, even if IR drop is the same, the auxiliary voltage transmitted to the auxiliary electrode is larger than the first voltage transmitted to the display electrode. The voltage difference between the auxiliary voltage on the auxiliary electrode and the pixel voltage supplied to the display electrode is smaller than a set value or approximately zero. During the display process, the auxiliary voltage is applied to the display electrode through the auxiliary electrode. Accordingly, the display effect as well as the display quality can be ensured.

In one embodiment, the display electrode is an electrode capable of controlling the display process, such as a common electrode or a pixel electrode of a liquid crystal display substrate and a cathode or an anode of an organic electroluminescent diode (OLED) of an organic electroluminescent diode display substrate (hereinafter OLED display substrate).

In one embodiment, the pixel voltage may be a reference voltage supplied to the common electrode and the cathode. In another embodiment, the pixel voltage may also be a voltage provided to the pixel electrode or the anode and the like.

In one embodiment, when the first electrode is the pixel electrode or the anode, the first electrodes of all pixel units are independent from one another and are arranged in an insulating mode. The signal lines used for transmitting signals to the first electrodes are usually made of a metal material. As such, the IR drop is small and the display effect is basically not influenced.

In one embodiment, when the first electrode is the common electrode or the cathode, the first electrode may be a plate-shaped electrode covering the whole display area. When the common electrode or the cathode is made of a transparent conductive material having a high-resistivity, the IR drop of the reference voltage in the transmission process is large, thereby severely influencing the display effect. According to one embodiment of the present disclosure, an auxiliary voltage can be supplied to the common electrode or the cathode at multiple points in the display area, thereby improving voltage uniformity of the common electrode and the cathode and accordingly the display quality.

In one embodiment, the first electrode may be a plate-shaped electrode covering the whole display area and having a large resistivity, so that a better improvement effect can be achieved. Further, the auxiliary electrode and the connecting structure may be arranged only in some of pixel units. An auxiliary voltage is applied to the first electrode at a plurality of points in the display area, so that the voltage uniformity of the first electrodes and accordingly the display quality are guaranteed.

The embodiments of the present disclosure will be described in further detail below with reference to the accompanying drawings and embodiments. The following examples are used to illustrate the disclosure but are not intended to limit the scope of the disclosure.

Embodiment 1

Figure 2:
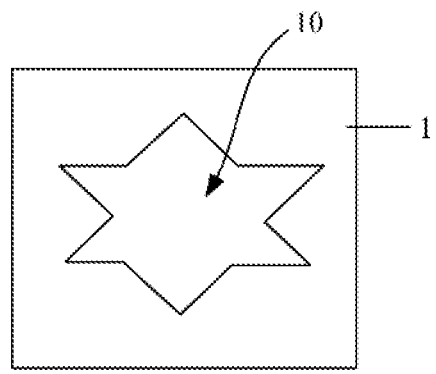
FIG. 2 is a top view of a flat layer according to one embodiment of the present disclosure.

As shown in FIG. 1 and FIG. 2, a display substrate is provided according to one embodiment of the present disclosure. The display substrate includes a plurality of pixel units. Each of the pixel units includes a first electrode 1 and a second electrode 2 that are arranged on a base substrate 100. The first electrode 1 and the second electrode 2 are used for controlling the display process. For example, for a liquid crystal display substrate, the first electrode 1 and the second electrode 2 are respectively a common electrode and a pixel electrode. For an OLED display substrate, the first electrode and the second electrode are respectively a cathode and an anode of the OLED.

At least some of the pixel units further comprise an auxiliary electrode 3 and a connecting structure 4 on the base substrate 100. The connecting structure 4 can realize electrical connection of the first electrode 1 and the auxiliary electrode 3 under the action of voltages having a first, preset voltage difference applied on the auxiliary electrode 3 and the first electrode 1 respectively, and then apply an auxiliary voltage to the first electrode 1 through the auxiliary electrode 3 in the display process.

In a display process, the voltage difference between the auxiliary voltage on the auxiliary electrode 3 and the pixel voltage supplied to the first electrode 1 is smaller than a set value or approximately zero. The auxiliary voltage is applied to the first electrode 1 through the auxiliary electrode 3, so that the display effect can be guaranteed.

According to the above embodiment, the auxiliary electrode and the connecting structure are arranged in at least some of the pixel units. Under the action of voltages of a first, preset voltage difference applied to the auxiliary electrode and the first electrode respectively, the connecting structure electrically connects the first electrode to the auxiliary electrode. The auxiliary voltage is then applied to the first electrode through the auxiliary electrode in the display process to reduce the voltage difference between the voltage on the first electrode and the pixel voltage, thereby achieving required display effect. As such, the display quality is not affected, and the problem that the first electrode cannot achieve required display effect because of the large IR drop is overcome.

Without being held to a particular theory, specific principle of one embodiment of the present disclosure is as follows:

In the display process, a driving unit provides a pixel voltage required for display to the first electrode. When the IR drop of the pixel voltage in the transmission process is large, the voltage difference between the first voltage actually transmitted to the first electrode and the pixel voltage is large, thereby influencing the display effect. The voltage difference between the auxiliary voltage on the auxiliary electrode and the pixel voltage supplied to the first electrode by the driving unit is set to be smaller than a preset value or approximately zero. Accordingly, during the display process, the auxiliary voltage is applied to the first electrode through the auxiliary electrode, thereby overcoming the display problem caused by large voltage difference between the first voltage on the first electrode and the corresponding pixel voltage due to large IR drop. As a result, the display quality is guaranteed.

The first voltage on the first electrode is the actual voltage applied to the electrode. Because of the IR drop, the actual voltage can be different from the voltage supplied to the electrode by the driving unit. The difference of the two is equal to the voltage drop caused by the IR drop.

In one embodiment, the first electrode 1 is a plate-shaped electrode which covers the whole display area and has a larger resistivity. A pixel voltage provided by the driving unit to the first electrode 1 is a reference voltage. For example, the first electrode is a common electrode of a liquid crystal display substrate or a cathode of a top emitting OLED display substrate. Because of the large IR drop of the pixel voltage supplied to the first electrode 1 in the transmission process, the display effect is influenced. By adopting the embodiments of the present disclosure, the problem that the display effect is influenced due to large IR drop can be effectively overcome.

Further, by arranging the auxiliary electrode 3 and the connecting structure 4 only in some of pixel units according to one embodiment of the present disclosure, the problem of the large voltage difference between the voltage on the first electrode 1 and the reference voltage caused by the IR drop can be solved, thereby improving uniformity of the reference voltages on the first electrodes 1. At the same time, the structure is simplified.

In one embodiment, the auxiliary electrode and the auxiliary signal lines used for transmitting the voltage signal to the auxiliary electrode can be made of metal materials with low electrical resistivity to reduce the IR drop of the voltage supplied to the auxiliary electrode in the transmission process. Specifically, both the voltages provided by the driving unit to the auxiliary electrode and the first electrode can be a reference voltage. Since the IR drop of the voltage supplied to the auxiliary electrode in the transmission process is small, the voltage difference of the auxiliary voltage actually applied to the auxiliary electrode and the reference voltage is smaller than a preset value, and accordingly the auxiliary voltage of the auxiliary electrode can be easily controlled. Therefore, the auxiliary voltage can be applied to the first electrode through the auxiliary electrode so that the first electrode can realize required display effect, thereby guaranteeing the display quality.

Without being held to a particular theory, the connecting structure according to one embodiment of the present disclosure achieves the above functions by means of electric breakdown principle, and may comprise the following steps:

Orthographic projection of the first electrode 1 on the substrate 100 and that of the auxiliary electrode 3 on the substrate 100 overlap to forman overlapping region.

The display substrate further includes an isolation layer 40 located between the first electrode 1 and the auxiliary electrode 3. The isolation layer 40 comprises a first part. Orthographic projection of the first part on the substrate 100 is located in the overlapping region. A thickness of the first part is smaller than that of other parts of the isolation layer 40. An electric breakdown occurs in the first part under action of voltages having a first, preset voltage difference on the auxiliary electrode 3 and the first electrode 1 respectively. As a result, the first part becomes conductive. The conductive first part forms the connecting structure 4.

The connecting structure is located between the first electrode and the auxiliary electrode mentioned above and is relatively thin in thickness. The connecting structure is formed by the conductive isolation layer 40 after electric breakdown. The conductive isolation layer 40 electrically connects the auxiliary electrode with the first electrode, which are located on the two sides of the isolation layer 40 respectively. Accordingly, an auxiliary voltage is applied to the first electrode through the auxiliary electrode.

If the auxiliary cathode is present, it is desirable that the auxiliary cathode and the cathode are electrically connected. However, since the isolation layer is formed by a large-area vapor deposition, various methods are used to remove the isolation layer or convert the isolation layer into a conductive layer where the auxiliary cathode is present. The embodiments of the present disclosure do not require addition of new masks and materials, and can effectively and conveniently achieve the connection between the auxiliary cathode and the cathode and reduce the VSS IR Drop.

Specific implementation embodiment of the connecting structure having the above function is not herein limited. For example, the connecting structure may comprise an electronic switch. The electronic switch is closed when voltages having a first, preset voltage difference are applied on the auxiliary electrode and the first electrode respectively, thereby short-circuiting the auxiliary electrode and the first electrode. Other specific embodiments are not enumerated herein.

The technical scheme of the present disclosure is applicable to all display apparatus that use electrodes to control the display process, for example, a liquid crystal display apparatus or an OLED display apparatus.

In one embodiment, for the liquid crystal display apparatus, an electric field is formed through the common electrodes and the pixel electrodes so as to drive liquid crystal molecules to deflect, thereby controlling the display process. The common electrode and the pixel electrode are both made of transparent conductive material. For a pixel unit, IR drop of the common voltage and that of the pixel voltage generated in the transmission process are basically the same, and thus have relatively small impact on the driving electric field formed by the two voltages. Therefore, the impact on the display quality is also small.

In another embodiment, for the OLED display substrate, different types of OLEDs may have different materials for the cathode and the anode. For example, for a top-emitting OLED, the anode may consist of a metal material, and the cathode may consist of a transparent conductive material. Since resistivity of the transparent conductive material is large, the IR drop is large, thereby affecting the display quality.

In one embodiment, the technical scheme of the present disclosure is suitable for a display apparatus with two display electrodes made from different materials. In one embodiment, the first electrode is a plate-shaped electrode which covers the whole display area and has larger resistivity. The technical scheme of the present disclosure can effectively overcome the display problem caused by the large IR drop.

The technical scheme of the present disclosure according to one embodiment is specifically described herein in reference with an OLED display substrate as a display substrate.

For an OLED display substrate, each of the pixel units includes an OLED emitting light of a specific color. The OLED comprises a cathode, an anode and a luminescent layer positioned between the cathode and the anode. It may further comprise an electron transport layer, a hole transport layer, an electron injection layer, a hole injection layer, and other functional layers. The specific structure is not described in detail herein.

At least some of the pixel units include an auxiliary electrode and a connecting structure. The connecting structure realizes electrical connection between the first electrode and the auxiliary electrode under action of voltages having a first, preset voltage difference on the auxiliary electrode and the first electrode respectively, so that the first electrode is electrically connected with the auxiliary electrode. Voltage difference between the auxiliary voltage on the auxiliary electrode and the corresponding pixel voltage of the first electrode is smaller than a set value or approximately zero. Therefore, applying the auxiliary voltage to the first electrode through the auxiliary electrode enables the first electrode to realize the required display, thereby guaranteeing the display effect.

For the top-emitting OLED, the cathode thereof is closer to the display side than the light emitting layer. A transparent conducting material is adopted for the cathode. A metal material is adopted for the anode. Since the cathode is a plate-shaped electrode covering the whole display area, the IR drop is large, thereby greatly affecting the display effect.

According to one embodiment of the present disclosure, the cathode of the top-emitting OLED is the first electrode 1 so as to overcome the display effect problem caused by the large IR drop of the cathode. The result thereof is remarkable. The second electrode 2 is an anode of the top-emitting OLED.

Further, the auxiliary electrode 3 of the top-emitting OLED display substrate uses a metal material with low resistivity. The auxiliary electrode 3 can be arranged on the same layer and made of the same metal film as the anode 2 of the OLED, thereby simplifying the fabricating process.

In one embodiment, a driving unit provides a reference voltage to the auxiliary electrode 3 and the cathode 1. Since the IR drop of the auxiliary electrode 3 is small, the voltage difference between the auxiliary voltage actually applied to the auxiliary electrode 3 and the reference voltage is smaller than a preset value or basically zero. The auxiliary voltage is applied to the cathode 1 through the auxiliary electrode 3, thereby guaranteeing the display effect.

In one embodiment, the connecting structure 4 is formed by a first part of an isolation layer 40 located between the cathode 1 and the auxiliary electrode 3. An electric breakdown occurs in the first part under the action of voltages having a first, preset voltage difference on the auxiliary electrode 3 and the first electrode 1 respectively. As a result, the first part becomes conductive. Then, the conductive first part electrically connects the auxiliary electrode 3 to the cathode 1. The corresponding specific structure is described above and the description is not repeated herein.

In one embodiment, the isolation layer 40 between the cathode 1 and the auxiliary electrode 3 is arranged on the same layer and made from the same thin film in one patterning process as at least a part of the light-emitting layer of the organic light-emitting diode, thereby simplifying the fabricating process.

In the embodiment, the connecting structure of the top-emitting OLED is located between the auxiliary electrode and the cathode with a relatively thin thickness, and formed by the conductive isolation layer after electric breakdown.

Since an active-matrix organic light-emitting diode display apparatus has a wide viewing angle, a high refresh rate, and a thin thickness, it becomes more and more widely used.

For an active-matrix organic light-emitting diode display substrate (hereinafter referred to as an AMOLED display substrate), each pixel unit further comprises a thin film transistor (not shown in the figure). The thin film transistor is covered with a flat layer 101. The OLED is arranged on the flat layer 101.

The flat layer 101 is provided with a plurality of accommodating holes 10. The auxiliary electrode 3 is located in the accommodating hole 10, so that the thickness of the product is not affected.

In one embodiment, a cross section of the accommodating hole 10 parallel to the plane where the substrate 100 is located is polygonal, so that the accommodating hole 10 has sharp angles. The isolation layer 40 is located in the accommodating hole 10. The first part is located on at least the wall of the accommodating hole 10. When electric breakdown occurs, the first part of the isolation layer 40 located between the auxiliary electrode 3, and the first electrode 1 becomes conductive, so that the first part electrically connects the auxiliary electrode 3 with the first electrode 1. The first part may be located at the sharp corners of the accommodating hole 10. Since a large electric field can be formed at the sharp corners, it is easy to generate electrical breakdown in the first part so that the first part becomes conductive. The wall of the accommodating hole 10 refers to an etching surface formed when the accommodating hole 10 is formed in the flat layer 101 through a photoetching process. Different shapes of the etching surface can be formed due to the effect of different etching processes and different etching materials. When a dry etching process is used to form the accommodating holes 10 in the flat layer 101, which is usually made of an organic resin material, a longitudinal cross-section of the accommodating hole 10 perpendicular to the plane where the substrate 100 is located is generally trapezoidal. There is a trend that a diameter of the accommodating hole 10 at a side close to the substrate 100 is smaller than that of the accommodating hole 10 at a side far away from the substrate 100.

In one embodiment, when the isolation layer 40 is arranged in the same layer and made from the same thin film as at least part of the light-emitting layer of the organic light-emitting diodes, the isolation layer 40 is located in the accommodating hole 10. The first part of the isolation layer 40 is located on at least the wall of the accommodating hole 10. Because of poor extensibility of the light-emitting material, the first part has a relatively thin thickness on the wall of the accommodating hole 10, which can be easily electrically broken down. Thus, the technical scheme mentioned above does not require an additional, separate fabricating process to form a first part of the isolation layer having a thin thickness, which can be achieved by utilizing the characteristic of the accommodating holes and the light-emitting materials. As used herein, the term "same layer" refers to the relationship between the layers simultaneously formed in the same step. The term "same layer" does not always mean that the thickness of the layer or the height of the layer in a cross-sectional view is the same.

When the display substrate of an AMOLED adopts a top-emitting OLED, the first electrode 1 is a cathode of the OLED. The cathode 1 is a plate-shaped electrode covering the whole display area, and a reference voltage is applied on the cathode. An auxiliary electrode 3 is located in the accommodating hole 10 in the flat layer 101. The auxiliary electrode 3 may be arranged in the same layer and made of the same metal film as the anode 2 of the OLED, thereby simplifying the fabricating process. An isolation layer 40 is arranged between the auxiliary electrode 3 and the cathode 1. The isolation layer 40 is arranged in the same layer as at least the light-emitting layer of the organic light-emitting diode. Because of poor extensibility of the light-emitting material, the thickness of the first part of the isolation layer 40 located on the wall of the accommodating hole 10 is thin, so that the first part of the isolation layer 40 can be easily electrically broken down under action of voltages having a first, preset voltage different on the auxiliary electrode 3 and the negative electrode 1 respectively. As a result, the auxiliary electrode 3 and the cathode 1 are electrically connected, thereby solving the display problem caused by the IR drop and guaranteeing the display quality.

For an AMOLED display substrate, a voltage provided by the driving unit is transmitted to the anode through a data line, which is made of metal. Thus the IR drop is small and accordingly does not affect the display effect.

The technical scheme of the present disclosure is not limited to the OLED display substrate described above. The technical scheme of the present disclosure is also applicable to other display technologies such as a liquid crystal display substrate. In one embodiment, for the liquid crystal display substrate, the first electrode is the common electrode. Specific embodiments and principles thereof are similar to those of the OLED display substrate, and thus are not described in detail herein.

Embodiment 2

A method of fabricating a display substrate is provided according to one embodiment of the present disclosure. The display substrate comprises a plurality of pixel units. The fabricating method comprises steps of forming a first electrode and a second electrode of each pixel unit on a substrate. The first electrode and the second electrode are used for controlling the display process.

The fabricating method further comprises the following steps:

An auxiliary electrode and a connecting structure are formed on the base substrate. The auxiliary electrode and the connecting structure are located in at least some of the pixel units. Under the action of voltages of a first, preset voltage difference on the auxiliary electrode and the first electrode respectively, the connecting structure electrically connects the first electrode with the auxiliary electrode.

According to the above fabricating method, by forming the auxiliary electrode and the connecting structure on at least some of the pixels, and applying the voltages of the preset voltage difference on the auxiliary electrode and the first electrode, the connecting structure electrically connects the first electrode with the auxiliary electrode. As such, by applying an auxiliary voltage to the first electrode through the auxiliary electrode in the display process, the voltage difference between the first electrode and the pixel voltage is reduced, thereby ensuring display effect and display quality. Also, the problem that the first electrode cannot realize required display effect caused by the large IR drop is overcome.

Accordingly, the voltage difference between the auxiliary voltage and the pixel voltage supplied to the first electrode is smaller than a preset value or approximately zero.

The auxiliary electrode and the auxiliary signal line used for transmitting the voltage signal to the auxiliary electrode may be, but is not limited to, a metal material with lower resistivity. As such, the IR drop of the voltage supplied to the auxiliary electrode in the transmission process is small and the auxiliary voltage on the auxiliary electrode can be easily controlled.

In one embodiment, the display substrate comprises an isolation layer located between the first electrode and the auxiliary electrode. The isolation layer comprises a first part. Under the action of the voltages having the first, preset voltage difference on the auxiliary electrode and the first electrode respectively, the first part is subjected to electrical breakdown, so that the first part becomes conductive. As a result, a required connecting structure is formed by the first part so that the first part electrically connects the auxiliary electrode with the first electrode. The corresponding specific structure is described as above, and is not repeated here.

The orthographic projection of the first electrode on the substrate overlaps with that of the auxiliary electrode on the substrate so that an overlapping region is formed. The fabricating method of the display substrate further comprises the following steps:

An isolation layer is formed between the first electrode and the auxiliary electrode. The isolation layer comprises a first part. The orthographic projection of the first part on the substrate is located in the overlapping region. The thickness of the first part is smaller than that of the other part of the isolation layer.

In one embodiment, forming the connecting structure specifically comprises the following steps:

Voltages having a first, preset voltage difference are applied to the auxiliary electrode and the first electrode respectively. The first pert is subjected to electrical breakdown by the applied voltages having the preset voltage difference on the auxiliary electrode and the first electrode, so that the first part becomes conductive. As a result, the connecting structure is formed by the first part after the first part becomes conductive.

The connecting structure prepared by the above steps is formed by the isolation layer which is located between the first electrode and the auxiliary electrode. A part of the connecting structure is relatively thin and becomes conductive after being subjected to the electric breakdown. The connecting structure electrically connects the first electrode with the auxiliary electrode and applies an auxiliary voltage to the first electrode through the auxiliary electrode.

In one embodiment, the technical scheme of the present disclosure is specifically described below by taking an OLED display substrate as the display substrate.

For an OLED display substrate, the fabricating method further comprises the following steps:

An organic electroluminescence diode of each pixel unit is formed.

In one embodiment, an isolation layer and at least part of a light-emitting layer of the organic light-emitting diode are made from the same luminescent material in one patterning process.

In the above step, the isolation layer and at least part of the light-emitting layer of the OLED are arranged in the same layer, so that the fabricating process can be simplified.

In one embodiment, the first electrode is the cathode of the OLED. Since the anodes of all the pixel units of the OLED are independent from each other and arranged in an insulating mode, the voltages supplied to the anodes by the driving unit are generally transmitted to the anodes through metal signal lines. Therefore, the IR drop thereof in the transmission process is small. However, for the cathode of the OLED, especially the cathode of the top emission OLED, the cathode is made of transparent electrical conductor and is generally a plate-shaped electrode covering the whole display area. Thus, when a reference voltage supplied to the cathode by the driving unit is transmitted from a side of the display area to another side, the IR drop is relatively large. As a result, the actual voltage on the corresponding cathode of the pixel unit farther away from the side where the driving unit is located deviates from the reference voltage more, thereby affecting the display effect.

In one embodiment, the technical scheme of the present disclosure is particularly suitable for top-emitting OLED. The auxiliary electrode may be arranged on the same layer and made of the same metal film as the anode of the OLED, thereby simplifying the fabricating process and reducing the cost.

For the top-emitting OLED, the fabricating method further comprises the following steps:

A thin film transistor of each pixel unit is formed.

A flat layer covering the thin film transistor is formed, and an organic light-emitting diode is formed on the flat layer.

A plurality of accommodating holes is formed in the flat layer. The auxiliary electrodes are located in the accommodating holes.

The OLED display substrate manufactured in the above steps is an AMOLED display substrate. By forming accommodating holes in the flat layer covering the thin film transistors and arranging the auxiliary electrode in the accommodating holes, the thickness of the product is not affected.

In one embodiment, the cross section of the accommodating hole parallel to the plane where the substrate is located is in a polygon shape. Thereby, the accommodating hole is provided with sharp angles. The isolation layer 40 is located in the accommodating hole 10. The first part is located on at least the wall of the accommodating hole 10. When electric breakdown occurs in the first part of the isolation layer 40 located between the auxiliary electrode 3 and the first electrode 1, the first part becomes conductive. The conductive first part forms the connecting structure, which electrically connects the auxiliary electrode 3 with the first electrode 1. Because the first part is located at the sharp corners of the accommodating hole where a strong electric field can be formed, the first part is easily subjected to electrical breakdown. Meanwhile, the isolation layer is arranged in the accommodating holes, so that the thickness of the product is not increased. When the isolation layer is made of a luminescent material, since the extensibility of the luminescent material is poor, the first part located on the wall of the accommodating holes is thin and easily electrically broken down. There is no need to add an independent fabricating process to enable the isolation layer to have a first part with a relatively thin thickness, which can be realized by utilizing the characteristics of the accommodating holes and the light-emitting materials.

Embodiment 3

A display apparatus is provided according to one embodiment of the present disclosure. The display apparatus comprises a display substrate and a driving unit of the first embodiment. The driving unit is electrically connected with the first electrode and the auxiliary electrode. The driving unit is used for providing a pixel voltage to the first electrode and for providing an auxiliary voltage to the auxiliary electrode. At least some of the pixel units of the display substrate comprise the auxiliary electrode and a connecting structure. When voltages having a first, preset voltage difference are applied to the auxiliary electrode and the first electrode respectively, the connecting structure electrically connects the first electrode with the auxiliary electrode. During the display process, the auxiliary voltage is applied to the first electrode through the auxiliary electrode. The voltage difference between the auxiliary voltage and the pixel voltage supplied to the first electrode is smaller than a preset value or approximately zero. Therefore, the display problem caused by the large voltage difference between the actual voltage transmitted to the first electrode and the corresponding pixel voltage due to large IR drop is solved, thereby guaranteeing display quality of the product.

The pixel units of the display apparatus are generally distributed in a matrix mode, including a plurality of rows of pixel units and a plurality of columns of pixel units intersecting horizontally and vertically.

When the display substrate is a substrate of a top-emitting OLED display, the first electrode is a cathode of the OLED, which is a plate-shaped electrode covering the whole display area. The driving unit is arranged on one side of the display substrate in the row direction. From one side of the display substrate where the driving unit is located to the other side, only some of the pixel units in some of the columns of the pixel units are provided with auxiliary electrodes. As such, it is possible to apply the auxiliary voltage to the cathodes at multiple points in the display area, thereby improving voltage uniformity of the cathode and ensuring display effect.

Specifically, in one embodiment, the number of columns of pixel units between two adjacent columns of auxiliary electrodes is the same. Further, for the auxiliary electrodes in the same column, the number of rows of pixel units between every two adjacent auxiliary electrodes is the same.

Embodiment 4

A driving method of a display apparatus in the third embodiment is provided according to one embodiment of the present disclosure. The method comprises the following steps:

In the display process, an auxiliary voltage is applied to the auxiliary electrode. The voltage difference between the auxiliary voltage and the pixel voltage provided to the first electrode in the display process is smaller than a preset value.

With the above driving method, in a display process, the auxiliary voltage is applied to the first electrode through the auxiliary electrode, so that the voltage difference between the voltage on the first electrode and the pixel voltage is reduced. As a result, the display effect is not affected and the display quality is guaranteed. Also, the problem that the first electrode cannot realize required display effect because of large IR drop is overcome.

Setting the voltage difference between the auxiliary voltage and the pixel voltage to a value smaller than a preset value is to ensure that when the auxiliary voltage is applied to the first electrode through the auxiliary electrode, the first electrode can realize the required display effect. The magnitude of the preset value depends on at least ranges of voltage variation allowed by a gray scale display corresponding to a certain color.

In one embodiment, the driving method may further comprise:

Before displaying, voltages having a first, preset voltage difference are applied to the auxiliary electrode and the first electrode respectively. By applying the voltages having the preset voltage difference on the auxiliary electrode and the first electrode, the connecting structure electrically connects the first electrode with the auxiliary electrode.

In this driving method, before the first display of the display apparatus, the connecting structure electrically connects the auxiliary electrode with the first electrode, so that in the display process, the auxiliary voltage can be applied to the first electrode through the auxiliary electrode.

In one embodiment, the connecting structure is formed by the first part of the isolation layer located between the first electrode and the auxiliary electrode after electric breakdown. Specific structure of the first part may reference the above content and is not described in detail herein. The magnitude of the first, preset voltage difference needs to ensure that the first part can realize electrical breakdown. Therefore, the magnitude of the first, preset voltage difference depends on at least specific structure of the connecting structure, which is not described in detail herein.

The step of the connecting structure electrically connecting the auxiliary electrode with the first electrode can also be completed in the fabricating process of the display substrate.

The electrical connection of the auxiliary electrode and the first electrode by the connecting structure is completed at one time. That is, once the auxiliary electrode and the first electrode are electrically connected, they are electrically connected permanently.

When the first electrode covers the whole display area and its resistivity is relatively high, and the pixel voltage provided to the first electrode is a reference voltage, the IR drop in the transmission process is large. By adopting the embodiments of the present disclosure, only some of the pixel units are arranged to include an auxiliary electrode and a connecting structure. Under action of the voltages having the first, preset voltage difference are applied on the auxiliary electrode and the first electrode respectively, the connecting structure electrically connects the first electrode with the auxiliary electrode. In the display process, the auxiliary voltage is applied to the first electrode through the auxiliary electrode. The voltage difference of the auxiliary electrode and the reference voltage is smaller than a preset value or approximately zero. As such, the auxiliary voltage may be applied to the first electrode through a plurality of points in the display area, thereby improving the voltage uniformity of the first electrode, and guaranteeing the display effect.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display substrate comprising:
a plurality of pixel units, each of the plurality of the pixel units comprising a first electrode and a second electrode on a base substrate,
wherein at least one of the pixel units further comprises an auxiliary electrode and a connecting structure between the auxiliary electrode and the fast electrode and the connecting structure is configured to electrically connect the auxiliary electrode to the first electrode,
the at least one of the pixel units comprises an isolation layer between the first electrode and the auxiliary electrode, the isolation layer comprising a first part; and
the first part is configured to form the connecting structure under action of voltages having a first voltage difference on the auxiliary electrode and the first electrode, and
a thickness of the first part is smaller than thicknesses of other parts of the isolation layer and the first part is configured to have electrical breakdown under the action of the voltages having the first voltage difference on the auxiliary electrode and the first electrode.

2. The display substrate according to claim 1, wherein the connecting structure is further configured to apply an auxiliary voltage to the first electrode through the auxiliary electrode.

3. The display substrate according to claim 1, wherein the auxiliary electrode is in a non-display region of the display substrate.

4. The display substrate according to claim 1, wherein the at least one of the pixel units further comprises an organic light-emitting diode, and the isolation layer and at least a part of a light-emitting layer of the organic light-emitting diode are made from a same thin film.

5. The display substrate according to claim 4, wherein the organic light-emitting diode is a top-emitting organic light-emitting diode, the first electrode is a cathode of the organic light-emitting diode, and the cathode is located on a side of the light-emitting layer away from the base substrate.

6. The display substrate according to claim 5, wherein the auxiliary electrode and an anode of the organic light-emitting diode are made from a same thin film.

7. The display substrate according to claim 1, wherein the at least one of the pixel units further comprises a flat layer, the flat layer comprising at least an accommodating hole, and the auxiliary electrode is located in the accommodating hole.

8. The display substrate according to claim 7, wherein a cross section of the accommodating hole parallel to a plane where the base substrate is located is polygonal; the isolation layer is located in the accommodating hole, and the first part is located on at least wall of the accommodating hole.

9. A display apparatus, comprising the display substrate of claim 1 and a driving circuit,
wherein the driving circuit is configured to provide a pixel voltage and an auxiliary voltage to the first electrode and the auxiliary electrode respectively, and a voltage difference between the auxiliary voltage and the pixel voltage is smaller than a preset value or approximately 0.

10. A method of driving the display apparatus according to claim 9, comprising:
applying the auxiliary voltage to the auxiliary electrodes; and
applying the pixel voltage to the first electrodes,
wherein a voltage difference between the auxiliary voltage and the pixel voltage in a display process is smaller than a preset value or approximately 0.

11. A method of fabricating a display substrate, comprising:
forming a first electrode and a second electrode in each of pixel units on a base substrate;
forming an auxiliary electrode and a connecting structure in at least one of the pixel units on the base substrate,
forming an isolation layer between the first electrode and the auxiliary electrode, the isolation layer comprising a first part,
wherein the connecting structure is configured to electrically connect the first electrode to the auxiliary electrode and provide an auxiliary voltage to the first electrode through the auxiliary electrode; and
a thickness of the first part is smaller than that of other parts of the isolation layer, and the first part is configured to form the connecting structure under action of voltages having a first voltage difference on the auxiliary electrode and the first electrode respectively.

12. The method of fabricating the display substrate according to claim 11, wherein forming the connecting structure comprises:
applying the voltages of the first voltage difference to the auxiliary electrodes and the first electrodes respectively,
wherein the first part is subjected to electrical breakdown under the action of the voltages of the first voltage difference on the auxiliary electrode and the first electrode respectively to form the connecting structure.

13. The method of fabricating the display substrate according to claim 12, wherein the fabricating method further comprises:
forming a thin film transistor in each of the pixel units;
forming a flat layer covering the thin film transistor; and
forming a plurality of accommodating holes in the flat layer,
wherein the auxiliary electrode is located in one of the accommodating holes, and the first part is located on at least wall of the one of the accommodating holes.

14. The method of fabricating the display substrate according to claim 13, wherein the display substrate is an organic light-emitting diode display substrate, the fabricating method further comprises:
forming an organic electroluminescence diode on the flat layer in each of the pixel units;
wherein the isolation layer and at least a part of a light-emitting layer of the organic light-emitting diode are made from a same luminescent material in one patterning process.

15. The method of fabricating the display substrate according to claim 14, wherein the organic light-emitting diode is a top-emitting organic light-emitting diode, the first electrode is a cathode of the top-emitting organic light-emitting diode; and the auxiliary electrode and an anode of the top-emitting organic light-emitting diodeare made from a same metal thin film in one patterning process.

* * * * *